United States Patent
Kim et al.

(10) Patent No.: US 11,495,642 B2
(45) Date of Patent: Nov. 8, 2022

(54) DISPLAY PANEL INCLUDING COLOR CONTROL LAYER

(71) Applicant: Samsung Display Co., LTD., Yongin-si (KR)

(72) Inventors: Jeongki Kim, Hwaseong-si (KR); Jeaheon Ahn, Hwaseong-si (KR); Seongyeon Lee, Asan-si (KR); Si-Wan Jeon, Hwaseong-si (KR); Tae Hyung Hwang, Seoul (KR)

(73) Assignee: Samsung Display Co., LTD., Yongin-si (KR)

( * ) Notice: Subject to any disclaimer, the term of this patent is extended or adjusted under 35 U.S.C. 154(b) by 250 days.

(21) Appl. No.: 16/871,011

(22) Filed: May 10, 2020

(65) Prior Publication Data

US 2021/0005671 A1  Jan. 7, 2021

(30) Foreign Application Priority Data

Jul. 4, 2019 (KR) .......................... 10-2019-0080777

(51) Int. Cl.
*H01L 27/32* (2006.01)
*H01L 51/52* (2006.01)

(52) U.S. Cl.
CPC ........ *H01L 27/322* (2013.01); *H01L 27/3244* (2013.01); *H01L 51/5246* (2013.01); *H01L 51/5253* (2013.01); *H01L 51/5284* (2013.01); *H01L 2251/5369* (2013.01)

(58) Field of Classification Search
None
See application file for complete search history.

(56) References Cited

U.S. PATENT DOCUMENTS

| 10,409,110 B2 | 9/2019 | Koo et al. |
| 2017/0076678 A1* | 3/2017 | Lee ........................ G02F 1/1336 |
| 2017/0125740 A1 | 5/2017 | Lee et al. |
| 2018/0031912 A1* | 2/2018 | Zhang .................... H01L 33/06 |

(Continued)

FOREIGN PATENT DOCUMENTS

| KR | 10-2017-0031613 | 3/2017 |
| KR | 10-2017-0051764 | 5/2017 |

(Continued)

*Primary Examiner* — Nduka E Ojeh
(74) *Attorney, Agent, or Firm* — H.C. Park & Associates, PLC

(57) ABSTRACT

A display panel including a lower display substrate including a light emitting element configured to generate source light, and an upper display substrate including first, second, and third pixel areas and a peripheral area adjacent thereto, in which the upper display substrate includes a base substrate, a first partition pattern disposed on a bottom surface of the base substrate, overlaps with the peripheral area, and has first, second, and third openings corresponding to the first, second, and third pixel areas, respectively, first, second, and third color filters disposed on the bottom surface of the base substrate and overlapping with the first, second, and third pixel areas, respectively, first, second, and third color control layers disposed on the first, second, and third color filters, respectively, and an encapsulation inorganic layer covering the second color control layer and exposing at least one of the first and third color control layers.

20 Claims, 9 Drawing Sheets

(56) References Cited

U.S. PATENT DOCUMENTS

| | | | |
|---|---|---|---|
| 2018/0074369 A1* | 3/2018 | Park | G02F 1/133528 |
| 2018/0157086 A1* | 6/2018 | Cho | G02F 1/13362 |
| 2018/0356677 A1 | 12/2018 | Kim et al. | |
| 2020/0168667 A1 | 5/2020 | Kim et al. | |
| 2022/0019003 A1* | 1/2022 | Ahn | G02B 5/201 |
| 2022/0045132 A1* | 2/2022 | Lee | H01L 27/322 |

FOREIGN PATENT DOCUMENTS

| | | |
|---|---|---|
| KR | 10-2018-0133979 | 12/2018 |
| KR | 10-2019-0014293 | 2/2019 |
| KR | 10-2020-0061475 | 6/2020 |

* cited by examiner

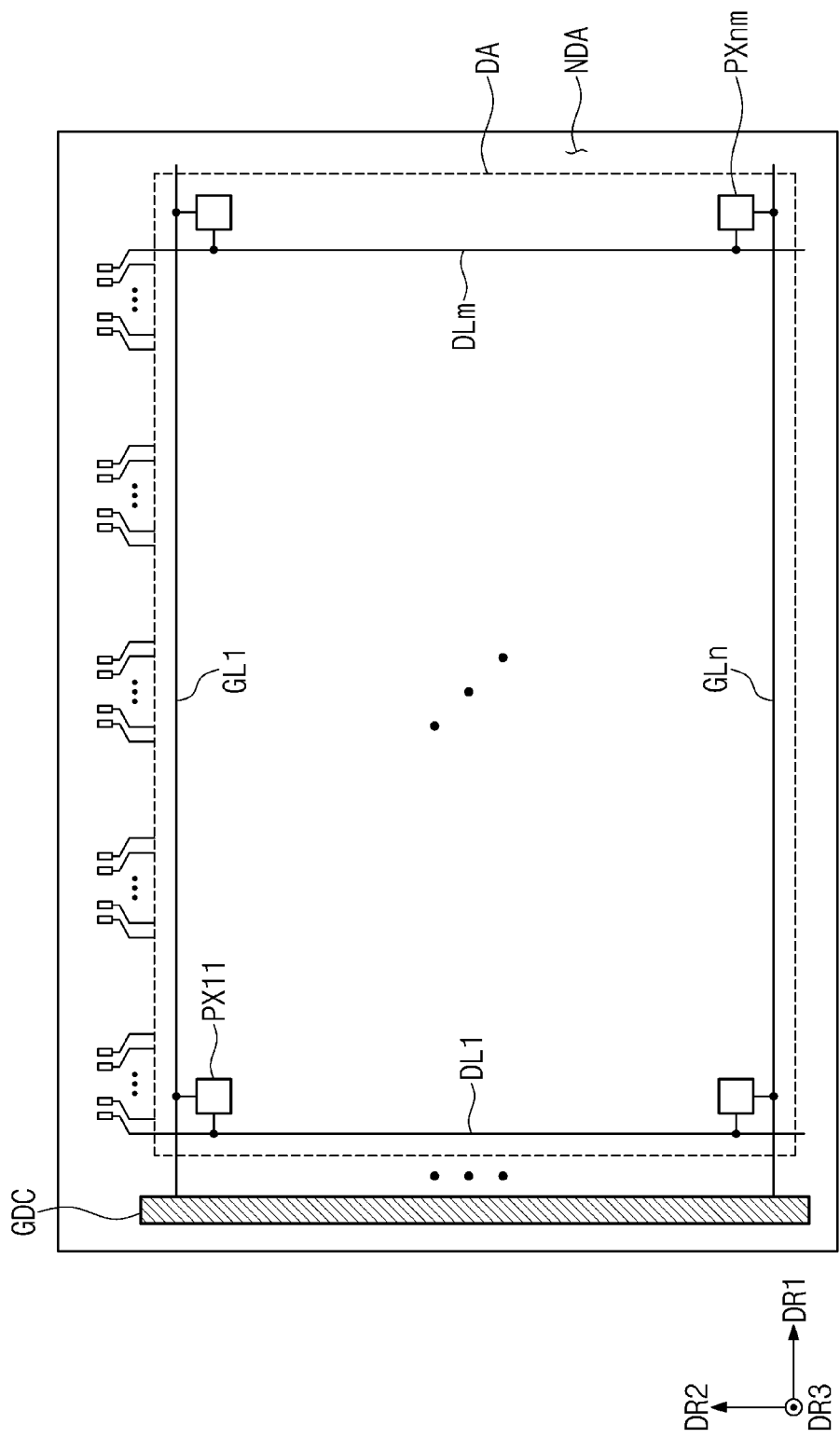

FIG. 9
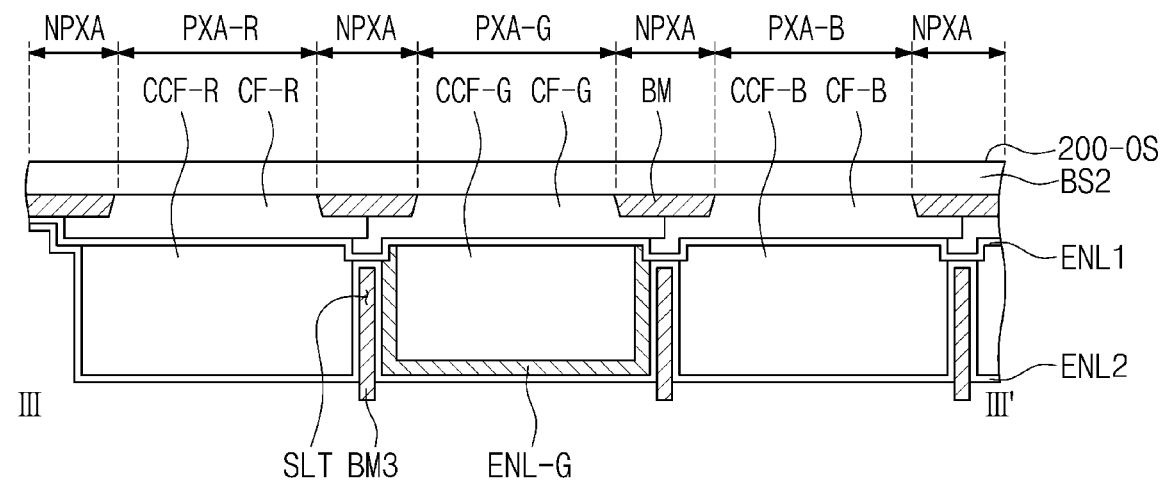

DISPLAY PANEL INCLUDING COLOR CONTROL LAYER

CROSS-REFERENCE TO RELATED APPLICATION

This application claims priority from and the benefit of Korean Patent Application No. 10-2019-0080777, filed on Jul. 4, 2019, which is hereby incorporated by reference for all purposes as if fully set forth herein.

BACKGROUND

Field

Exemplary embodiments of the invention relate generally to a display panel and, more specifically, to a display panel including a quantum dot layer and an inorganic layer encapsulating the quantum dot layer.

Discussion of the Background

A display panel may include a transmissive display panel which selectively transmits source light generated from a light source, or a light emitting display panel which generates source light by itself. To generate a color image, the display panel may include different kinds of color control layers depending on pixels. The color control layer may transmit light in of a partial wavelength range in source light, or may convert a color of source light. A certain color control layer may not change a color of source light, but may change characteristics of light.

The above information disclosed in this Background section is only for understanding of the background of the inventive concepts, and, therefore, it may contain information that does not constitute prior art.

SUMMARY

Display panels constructed according to exemplary embodiments of the invention are capable of improving life span and light output efficiency.

Additional features of the inventive concepts will be set forth in the description which follows, and in part will be apparent from the description, or may be learned by practice of the inventive concepts.

A display panel according to an exemplary embodiment includes a lower display substrate including a light emitting element configured to generate source light, and an upper display substrate including first, second, and third pixel areas and a peripheral area adjacent to the first, second, and third pixel areas, in which the upper display substrate includes a base substrate, a first partition pattern disposed on a bottom surface of the base substrate, overlaps with the peripheral area, and has first, second, and third openings corresponding to the first, second, and third pixel areas, respectively, first, second, and third color filters disposed on the bottom surface of the base substrate and overlapping with the first, second, and third pixel areas, respectively, first, second, and third color control layers disposed on the first, second, and third color filters, respectively, and an encapsulation inorganic layer covering the second color control layer and exposing at least one of the first and third color control layers.

The display panel may further include a first inorganic layer disposed on the bottom surface of the base substrate, on the first partition pattern, and on the first, second, and third color filters.

The encapsulation inorganic layer may be in contact with the first inorganic layer, and the second color control layer may be encapsulated by the first inorganic layer and the encapsulation inorganic layer.

The first color control layer and the third color control layer may be in contact with the encapsulation inorganic layer.

The display panel may further include a second inorganic layer disposed on the first color control layer, the third color control layer, and the encapsulation inorganic layer, in which the second inorganic layer may be in contact with the encapsulation inorganic layer.

The source light may be third color light, the first color control layer may be configured to convert the third color light into first color light, he second color control layer may be configured to convert the third color light into second color light, and the third color control layer may be configured to transmit the third color light, and the first color filter may be configured to transmit the first color light, the second color filter may be configured to transmit the second color light, and the third color filter may be configured to transmit the third color light.

The first color control layer may include a base resin and first quantum dots mixed with the base resin, and the second color control layer may include a base resin and second quantum dots mixed with the base resin, and a weight % of the second quantum dots in the second color control layer may be greater than a weight % of the first quantum dots in the first color control layer.

The first color control layer may include a base resin and first quantum dots mixed with the base resin, and the second color control layer may include a base resin and second quantum dots mixed with the base resin, and the number of the second quantum dots per volume in the second color control layer may be greater than the number of the first quantum dots per volume in the first color control layer.

The first partition pattern may include a black coloring agent.

The display panel may further include a second partition pattern disposed on the bottom surface of the base substrate, overlaps with the first partition pattern, and has first and second openings corresponding to at least the first and second pixel areas, respectively.

The second partition pattern may be configured to transmit the third color light, and the second partition pattern and the third color filter may form a single body shape.

The second partition pattern may be closer to the base substrate than the first partition pattern.

The first, second, and third color control layers may be spaced apart from each other in the peripheral area.

The display panel may further include a third partition pattern disposed between the first, second, and third color control layers in the peripheral area.

The light emitting element may include first, second, and third light emitting elements disposed to correspond to the first, second, and third pixel areas, respectively, and emission layers of the first, second and third light emitting elements may form a single body shape.

A display panel according to another exemplary embodiment includes a lower display substrate configured to generate source light, and an upper display substrate including first, second, and third pixel areas and a peripheral area adjacent to the first, second, and third pixel areas, in which the upper display substrate includes a base substrate, a color pattern disposed on a bottom surface of the base substrate, overlaps with the peripheral, area and the third pixel area, and has first and second openings corresponding to the first and second pixel areas, respectively, first and second color filters disposed on the bottom surface of the base substrate and overlap with the first and second pixel areas, respectively, first, second, and third color control layers disposed on the first and second color filters and the color pattern, respectively, and an encapsulation inorganic layer covering the second color control layer.

The display panel may further include a partition pattern disposed on the bottom surface of the base substrate and has first, second, and third openings corresponding to the first, second, and third pixel areas, respectively.

The color pattern may have substantially the same color as the source light, and the partition pattern may have a black color.

The color pattern may include an inner edge defining the second opening, and a distance between the inner edge and the encapsulation inorganic layer on a reference line parallel to the bottom surface of the base substrate may be about 12 micrometers or less.

The display panel may further include an inorganic layer covering the first color control layer, the third color control layer, and the encapsulation inorganic layer, and the encapsulation inorganic layer may be in contact with the inorganic layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIG. 2 is a plan view illustrating a display panel according to an exemplary embodiment.

FIG. 9 is a cross-sectional view illustrating an upper display substrate corresponding to a display area according to an exemplary embodiment.

DETAILED DESCRIPTION

Figure 1A:
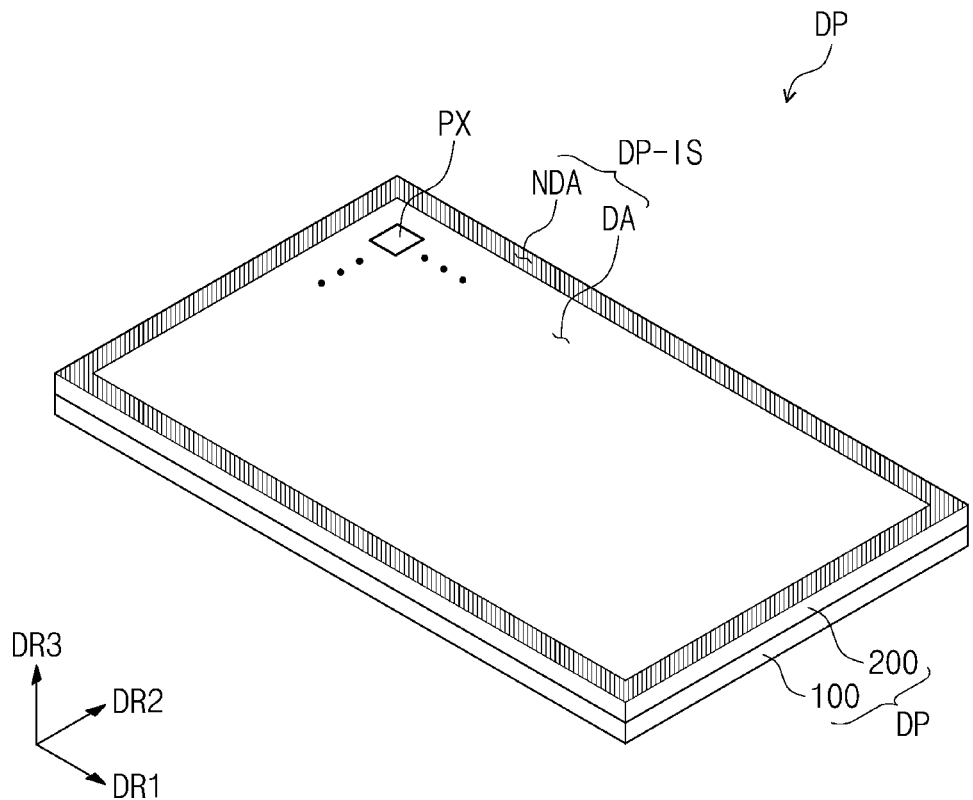
FIG. 1A is a perspective view illustrating a display panel according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 1B:
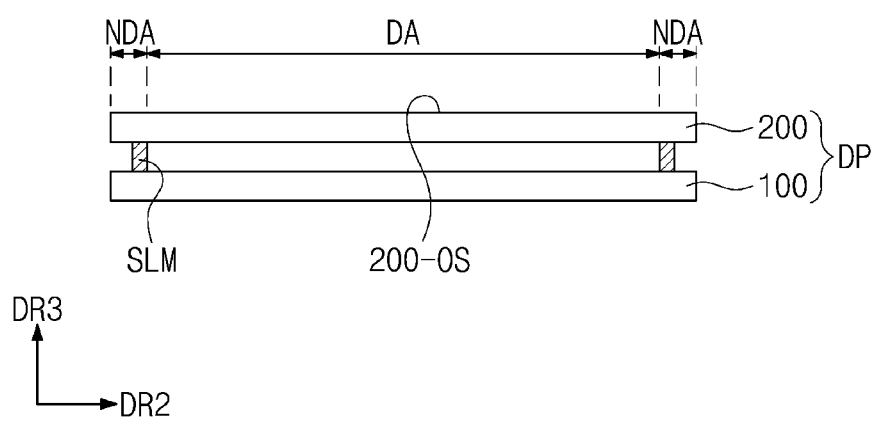
FIG. 1B is a cross-sectional view illustrating a display panel according to an exemplary embodiment.

FIG. 1A is a perspective view illustrating a display panel DP according to an exemplary embodiment. FIG. 1B is a cross-sectional view illustrating the display panel DP according to an exemplary embodiment. FIG. 2 is a plan view illustrating the display panel DP according to an exemplary embodiment.

Referring to FIGS. 1A, 1B, and 2, the display panel DP may be a liquid crystal display panel, an electrophoretic display panel, a microelectromechanical system (MEMS) display panel, an electrowetting display panel, or an organic light emitting display panel, without being limited thereto.

The display panel DP may further include a chassis member or a molding member, and may further include a backlight unit in accordance with a type of the display panel DP.

The display panel DP may include a first display substrate (or a lower display substrate) 100 and a second display substrate (or an upper display substrate) 200 facing each other while being spaced apart from each other. A cell gap may be formed between the first display substrate 100 and the second display substrate 200. The cell gap may be maintained by a sealant SLM coupling the first display substrate 100 and the second display substrate 200. A gray scale display layer for generating an image may be disposed between the first display substrate 100 and the second display substrate 200. The gray scale display layer may include a liquid crystal layer, an organic light emitting layer, or an electrophoretic layer, in accordance with a type of the display panel DP.

As illustrated in FIG. 1A, the display panel DP may display an image through a display surface DP-IS. An outer surface 200-OS of the second display substrate 200 of FIG. 1B may be defined as the display surface DP-IS.

The display surface DP-IS may be parallel to a plane defined by a first directional axis DR1 and a second directional axis DR2. The display surface DP-IS may include a display area DA and a non-display area NDA. A pixel PX may be disposed in the display area DA but may not be disposed in the non-display area NDA. The non-display area NDA may be defined along a border of the display surface DP-IS. The display area DA may be surrounded by the non-display area NDA. Alternatively, in other exemplary embodiments, the non-display area NDA may be omitted, or may be disposed adjacent to only one side of the display area DA.

A normal direction of the display surface DP-IS (e.g., a thickness direction of the display panel DP) may be indicated by a third directional axis DR3. Hereinafter, a front surface (or a top surface) and a rear surface (or a bottom surface) of each of layers or units may be defined by the third directional axis DR3. However, the first to third directional axes DR1, DR2 and DR3 used herein are merely exemplary. Hereinafter, first to third directions are defined as directions indicated by the first to third directional axes DR1, DR2 and DR3, respectively, and are indicated by the same reference designators as the first to third directional axes DR1, DR2 and DR3, respectively.

The display panel DP according to the illustrated exemplary embodiment has a planar display surface DP-IS. However, the inventive concepts are not limited thereto. In other exemplary embodiments, the display panel DP may include a curved display surface or a three-dimensional (3D) display surface. The 3D display surface may include a plurality of display areas indicated by different directions.

FIG. 2 illustrates planar arrangement of signal lines GL1 to GLn and DL1 to DLm and pixels PX11 to PXnm. The signal lines GL1 to GLn and DL1 to DLm may include a plurality of gate lines GL1 to GLn and a plurality of data lines DL1 to DLm.

Each of the pixels PX11 to PXnm may be connected to a corresponding one of the plurality of gate lines GL1 to GLn and a corresponding one of the plurality of data lines DL1 to DLm. Each of the pixels PX11 to PXnm may include a pixel driving circuit and a display element. In some exemplary embodiments, additional type of signal lines may be provided in the display panel DP in accordance with configuration of the pixel driving circuit of each of the pixels PX11 to PXmn.

The pixels PX11 to PXnm shown in FIG. 2 are exemplarily illustrated as being arranged in a matrix form. However, the inventive concepts are not limited thereto. In another exemplary embodiment, the pixels PX11 to PXnm may be arranged in a pentile form. In still another exemplary embodiment, the pixels PX11 to PXnm may be arranged in a diamond form. A gate driving circuit GDC may be integrated in the display panel DP by an oxide silicon gate driving circuit (OSG) process or an amorphous silicon gate driving circuit (ASG) process.

Figure 3A:
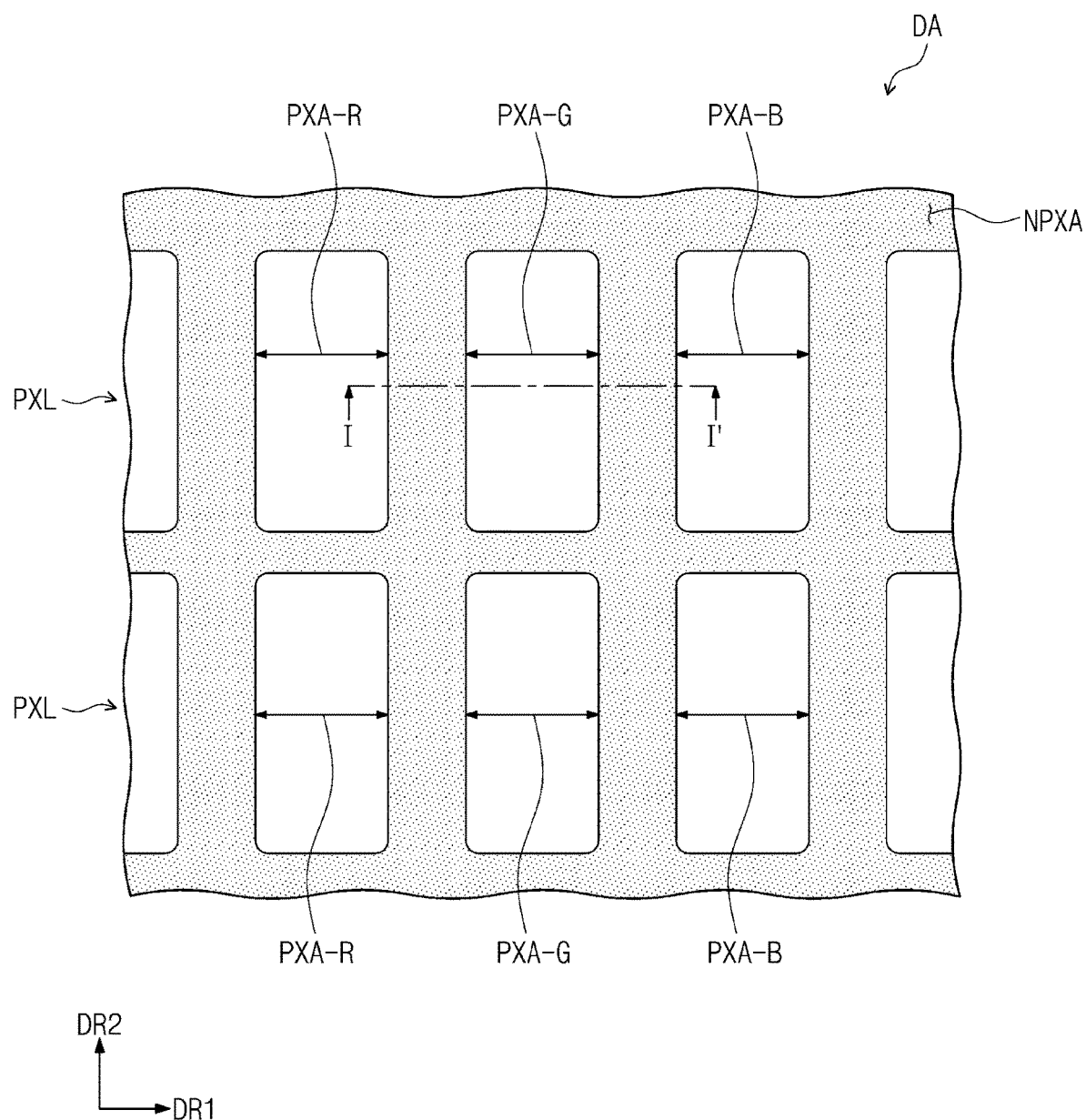
FIG. 3A is a plan view illustrating a display area of a display panel according to an exemplary embodiment.
Figure 3B:
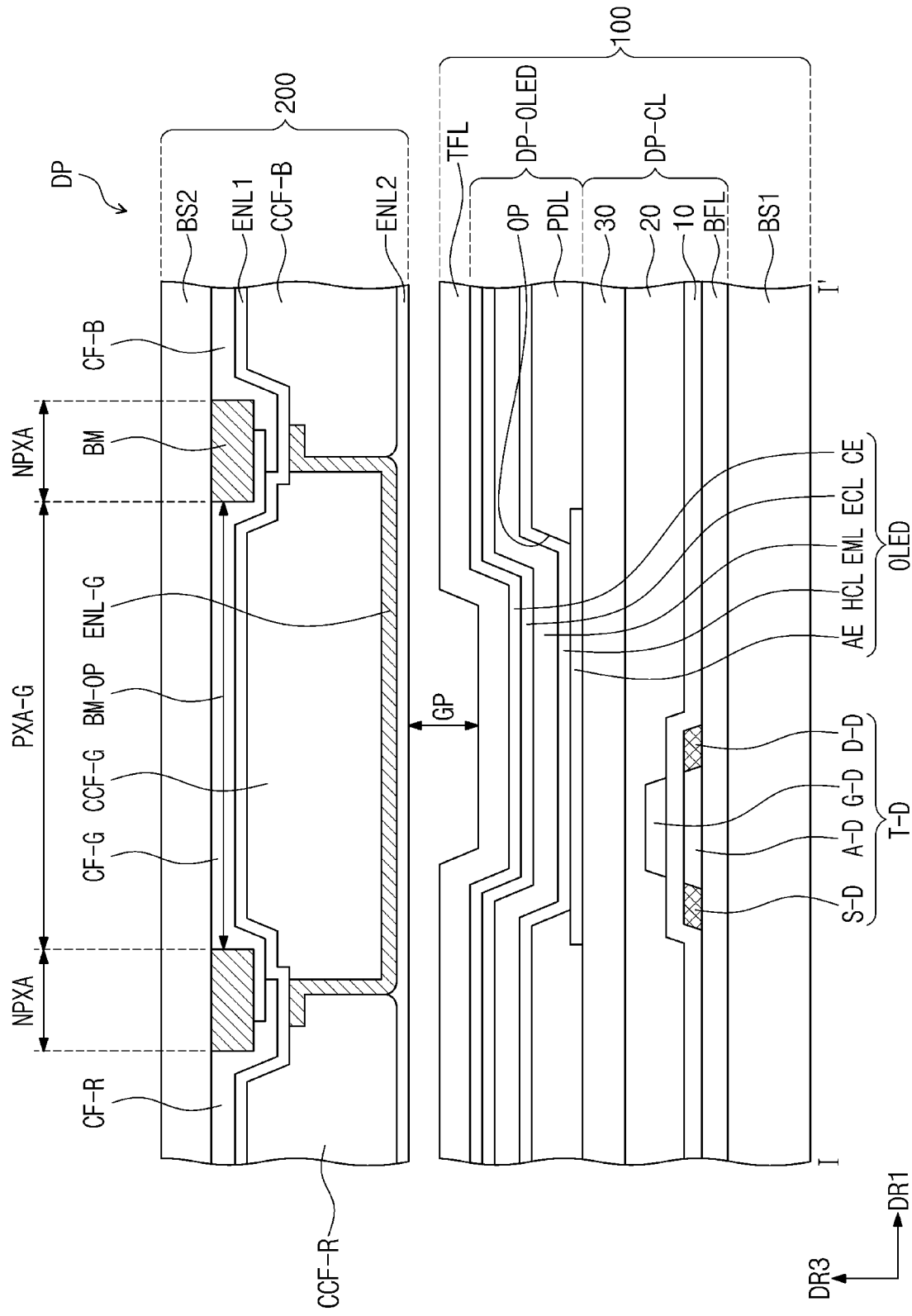
FIG. 3B is a cross-sectional view illustrating a display area of a display panel according to an exemplary embodiment.

FIG. 3A is a plan view illustrating a display area DA of a display panel DP according to an exemplary embodiment. FIG. 3B is a cross-sectional view illustrating the display area DA of the display panel DP according to an exemplary embodiment. FIG. 3A illustrates a plurality of pixel areas PXA-R, PXA-G, and PXA-B when viewed from the outer surface 200-OS of the second display substrate 200 illustrated in FIG. 1B. Six pixel areas PXA-R, PXA-G and PXA-B included in two pixel rows PLX are exemplarily illustrated. FIG. 3B illustrates a cross-sectional view taken along line I-I' of FIG. 3A.

Referring to FIG. 3A, three kinds of the pixel areas PXA-R, PXA-G, and PXA-B illustrated in FIG. 3A may be repeatedly arranged in the entire display area DA. A peripheral area NPXA may be disposed around each of first to third pixel areas PXA-R, PXA-G, and PXA-B. The peripheral area NPXA may define boundaries of the first to third pixel areas PXA-R, PXA-G, and PXA-B, and may prevent a color mixing phenomenon between the first to third pixel areas PXA-R, PXA-G, and PXA-B.

The first to third pixel areas PXA-R, PXA-G, and PXA-B according to the illustrated exemplary embodiment are shown as having the same planar areas (or sizes) with each other. However, the inventive concepts are not limited thereto. In some exemplary embodiments, at least two of the first to third pixel areas PXA-R, PXA-G, and PXA-B may have different areas (or sizes) from each other. The first to third pixel areas PXA-R, PXA-G, and PXA-B are exemplarily illustrated as having rectangular shapes having round corner areas in a plan view. However, the inventive concepts are not limited thereto. In some exemplary embodiments, each of the first to third pixel areas PXA-R, PXA-G, and PXA-B may have a polygonal shape, such as a lozenge shape or a pentagonal shape when viewed in a plan view.

One of the first to third pixel areas PXA-R, PXA-G, and PXA-B may provide third color light corresponding to source light, another one of the first to third pixel areas PXA-R, PXA-G, and PXA-B may provide first color light different from the third color light, and the last one of the first to third pixel areas PXA-R, PXA-G, and PXA-B may provide second color light different from the third color light and the first color light. In the illustrated exemplary embodiment, the third pixel area PXA-B may provide the third color light. In the illustrated exemplary embodiment, the first pixel area PXA-R may provide red light, the second pixel area PXA-G may provide green light, and the third pixel area PXA-B may provide blue light.

FIG. 3B illustrates a cross-sectional view corresponding to a driving transistor T-D and a light emitting element OLED. A gap GP may be formed between an upper display substrate 200 and a lower display substrate 100.

As illustrated in FIG. 3B, the lower display substrate 100 may include a first base substrate BS1, a circuit element layer DP-CL disposed on the first base substrate BS1, a display element layer DP-OLED disposed on the circuit element layer DP-CL, and an upper insulating layer TFL disposed on the display element layer DP-OLED.

The first base substrate BS1 may include a synthetic resin substrate or a glass substrate. The circuit element layer DP-CL may include at least one insulating layer and a circuit element. The circuit element may include a signal line and a driving circuit of a pixel. The circuit element layer DP-CL may be formed through processes of forming the insulating layer, a semiconductor layer, and a conductive layer by coating and/or deposition methods, and processes of patterning the insulating layer, the semiconductor layer, and the conductive layer by photolithography processes.

In the illustrated exemplary embodiment, the circuit element layer DP-CL may include a buffer layer BFL, a first insulating layer 10, a second insulating layer 20, and a third insulating layer 30. For example, the buffer layer BFL, the first insulating layer 10, and the second insulating layer 20 may be inorganic layers, and the third insulating layer 30 may be an organic layer.

Arrangement relation of an active region A-D, a source S-D, a drain D-D, and a gate G-D of the driving transistor T-D is exemplarily illustrated in FIG. 3B. The active region A-D, the source S-D, and the drain D-D may be regions of a semiconductor pattern, which are divided depending on a doping concentration or conductivity.

The display element layer DP-OLED may include the light emitting element OLED. The light emitting element OLED may generate the source light described above. The light emitting element OLED may include a first electrode AE, a second electrode CE, and an emission layer EML disposed therebetween. In the illustrated exemplary embodiment, the display element layer DP-OLED may include an organic light emitting diode as the light emitting element OLED. The display element layer DP-OLED may include a pixel defining layer PDL. For example, the pixel defining layer PDL may be an organic layer.

The first electrode AE may be disposed on the third insulating layer 30. The first electrode AE may be connected directly or indirectly to the driving transistor T-D. However, a connection structure of the first electrode AE and the driving transistor T-D is not illustrated in FIG. 3B. An opening OP may be defined in the pixel defining layer PDL. The opening OP of the pixel defining layer PDL may expose at least a portion of the first electrode AE.

A hole control layer HCL, the emission layer EML, and an electron control layer ECL may be disposed in common in the pixel area PXA-G and the peripheral area NPXA. The hole control layer HCL, the emission layer EML, and the electron control layer ECL may be disposed in common in the first to third pixel areas PXA-R, PXA-G, and PXA-B (see FIG. 3A).

The hole control layer HCL may include a hole transfer layer and may further include a hole injection layer. The emission layer EML may generate blue light, for example. The blue light may have a wavelength of about 410 nm to about 480 nm. Emission spectrum of the blue light may have the maximum peak in a range of about 440 nm to about 460 nm. The electron control layer ECL may include an electron transfer layer, and may further include an electron injection layer. The emission layer EML may be disposed in common in the first to third pixel areas PXA-R, PXA-G, and PXA-B, or may be independently disposed in each of the first to third pixel areas PXA-R, PXA-G, and PXA-B. When the emission layer EML is independently disposed, the emission layers EML of the first to third pixel areas PXA-R, PXA-G, and PXA-B may be separated from each other. The second electrode CE may be disposed on the electron control layer ECL. The second electrode CE may be disposed in common in the first to third pixel areas PXA-R, PXA-G, and PXA-B.

The upper insulating layer TFL may be disposed on the second electrode CE to protect the second electrode CE. The upper insulating layer TFL may include an organic material or an inorganic material. In an exemplary embodiment, the upper insulating layer TFL may have a multi-layered structure, in which an inorganic layer/an organic layer are repeated. The upper insulating layer TFL may have a sealing or encapsulation structure of an inorganic layer/an organic layer/an inorganic layer. The upper insulating layer TFL may further include a refractive index control layer for improving light output efficiency.

The lower display substrate 100 may include first, second, and third display elements corresponding to the first, second, and third pixel areas PXA-R, PXA-G, and PXA-B of FIG. 3A, respectively. The first, second, and third display elements may have the same stack structure, and may have the stack structure of the light emitting element OLED illustrated in FIG. 3B.

As illustrated in FIG. 3B, the upper display substrate 200 may include a second base substrate BS2, a partition pattern BM, a color filter CF-G, and a color control layer CCF-G. The partition pattern BM, the color filter CF-G, and the color control layer CCF-G may be disposed on a bottom surface of the second base substrate BS2. In addition, the upper display substrate 200 may further include a plurality of encapsulation layers ENL1, ENL2, and ENL-G.

The second base substrate BS2 may include a synthetic resin substrate or a glass substrate. The partition pattern BM may be disposed on the bottom surface of the second base substrate BS2. The partition pattern BM may be disposed in the peripheral area NPXA. An opening BM-OP corresponding to each of the first to third pixel areas PXA-R, PXA-G, and PXA-B may be defined in the partition pattern BM. In the illustrated exemplary embodiment, the pixel area PXA-G may be defined to correspond to the opening BM-OP of the partition pattern BM.

In the illustrated exemplary embodiment, the partition pattern BM may be a pattern having a black color, and may be a black matrix. The partition pattern BM may include a black coloring agent. The black coloring agent may include a black dye or a black pigment. The black coloring agent may include carbon black, a metal (e.g., chromium), or an oxide thereof.

The openings BM-OP formed in the partition pattern BM may be defined differently depending on optical properties of the partition pattern BM. In the partition pattern BM which mostly blocks the entire wavelength band of visible light as in the illustrated exemplary embodiment, the opening BM-OP may be defined to correspond to each of the first to third pixel areas PXA-R, PXA-G, and PXA-B. Alternatively, a smaller number of the openings BM-OP may be defined in the partition pattern BM which transmits specific color light (e.g., red light, green light, or blue light).

The color filter CF-G may be disposed on the bottom surface of the second base substrate BS2. The color filter CF-G may include a base resin and a dye and/or a pigment dispersed in the base resin. The base resin may be a medium in which the dye and/or the pigment are dispersed. The base resin may be formed of at least one of various resin composites generally referred to as binders. The color filter CF-G may overlap with the pixel area PXA-G. An edge region of the color filter CF-G may overlap with the peripheral area NPXA. A portion of the partition pattern BM may be disposed between the color filter CF-G and the bottom surface of the second base substrate BS2.

A first encapsulation layer ENL1 may be disposed under the color filter CF-G. The first encapsulation layer ENL1 may encapsulate the color filter CF-G. The first encapsulation layer ENL1 may be disposed in common in the first to third pixel areas PXA-R, PXA-G, and PXA-B.

The first encapsulation layer ENL1 may include an inorganic layer (hereinafter, may also be referred to as a first inorganic layer). The first encapsulation layer ENL1 may include silicon oxide, silicon nitride, or silicon oxynitride. The first encapsulation layer ENL1 may further include an organic layer providing a flat bottom surface.

The color control layer CCF-G may be disposed on a bottom surface of the first encapsulation layer ENL1 to correspond to the color filter CF-G. In the illustrated exemplary embodiment, the color control layer CCF-G may absorb the source light generated from the light emitting element OLED, and then may generate light having a different color from that of the source light. The color control layer CCF-G may transmit and scatter a portion of the source light incident thereto.

The color control layer CCF-G may include a base resin and quantum dots mixed with (or dispersed in) the base resin. In the illustrated exemplary embodiment, the color control layer CCF-G may be defined as a quantum dot layer. The base resin may be a medium in which the quantum dots are dispersed. The base resin may be formed of at least one of various resin composites generally referred to as binders. However, the inventive concepts are not limited thereto. For example, a medium capable of dispersing the quantum dots may be used as the base resin regardless of its name, additional function and/or constituent material. In some exemplary embodiments, the base resin may be a polymer resin. For example, the base resin may be an acrylic-based resin, a urethane-based resin, a silicon-based resin, or an epoxy-based resin. The base resin may be a transparent resin.

The quantum dots may be particles configured to convert a wavelength of incident light. Each of the quantum dots may be a material having a crystal structure having a size of several nanometers, and may be composed of hundreds to thousands of atoms. The quantum dots may show a quantum confinement effect, in which an energy band gap is increased by the small size. When light of a wavelength corresponding to energy greater than the energy band gap is incident to the quantum dots, the quantum dots may be excited by absorbing light, and then may transition to a ground state while emitting light of a specific wavelength. Energy of the emitted light may correspond to the energy band gap. Light emitting characteristics of the quantum dots by the quantum confinement effect may be adjusted by adjusting the sizes and/or the compositions of the quantum dots.

The quantum dots may be formed of a group II-VI compound, a group III-V compound, a group IV-VI compound, a group IV element, a group IV compound, or any combination thereof.

The group II-VI compound may be selected from a group consisting of a binary compound selected from a group consisting of CdSe, CdTe, ZnS, ZnSe, ZnTe, ZnO, HgS, HgSe, HgTe, MgSe, MgS, and any mixture thereof; a ternary compound selected from a group consisting of AgInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and any mixture thereof; and a quaternary compound selected from a group consisting of HgZnTeS, CdZnSeS, CdZnSeTe, CdZnSTe, CdHgSeS, CdHgSeTe, CdHgSTe, HgZnSeS, HgZnSeTe, HgZnSTe, and any mixture thereof.

The group III-V compound may be selected from a group consisting of a binary compound selected from a group consisting of GaN, GaP, GaAs, GaSb, AlN, AlP, AlAs, AlSb, InN, InP, InAs, InSb, and any mixture thereof; a ternary compound selected from a group consisting of GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and any mixture thereof; and a quaternary compound selected from a group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and any mixture thereof. The group IV-VI compound may be selected from a group consisting of a binary compound selected from a group consisting of SnS, SnSe, SnTe, PbS, PbSe, PbTe, and any mixture thereof; a ternary compound selected from a group consisting of SnSeS, SnSeTe, SnSTe, PbSeS, PbSeTe, PbSTe, SnPbS, SnPbSe, SnPbTe, and any mixture thereof; and a quaternary compound selected from a group consisting of SnPbSSe, SnPbSeTe, SnPbSTe, and any mixture thereof. The group IV element may be selected from a group consisting of Si, Ge, and a mixture thereof. The group IV compound may be a binary compound selected from a group consisting of SiC, SiGe, and a mixture thereof.

In these cases, the binary compound, the ternary compound, or the quaternary compound may exist in the quantum dot with a substantially uniform concentration. Alternatively, a concentration of the binary compound, the ternary compound, or the quaternary compound in a portion of the quantum dot may be different from that of the binary compound, the ternary compound, or the quaternary compound in another portion of the quantum dot.

Each of the quantum dots may have a core-shell structure including a core and a shell surrounding the core. Alternatively, the quantum dot may have a core/shell structure in which one quantum dot surrounds another quantum dot. An interface of the core and the shell may have a concentration gradient, in which a concentration of an element existing in the shell becomes progressively less toward a center.

The quantum dots may be nano-sized particles. Each of the quantum dots may have a full width of half maximum (FWHM) of an emission wavelength spectrum that is about 45 nm or less, in particular, about 40 nm or less, and in more particular, about 30 nm or less, and color purity and/or color reproduction may be improved in this range. In addition, light emitted through the quantum dots may be emitted in all directions, and thus, a wide viewing angle may be improved or realized.

Furthermore, a shape of each of the quantum dots may be a general shape known in the art, but is not limited to a specific shape. For example, each of the quantum dots may have a spherical shape, a pyramidal shape, a multi-arm shape, a cubic nanoparticle shape, a nanotube shape, a nanowire shape, a nanofiber shape, or a nano-plate particle shape. A color of light emitted from the quantum dot may be controlled depending on a particle size of the quantum dot, and thus, the quantum dot may have one of various emission colors, such as a red color, a green color, and a blue color.

An encapsulation inorganic layer ENL-G covering the color control layer CCF-G may be disposed on the bottom surface of the first encapsulation layer ENL1. The encapsulation inorganic layer ENL-G may prevent moisture from permeating into the color control layer CCF-G. The encapsulation inorganic layer ENL-G may include silicon oxide, silicon nitride, or silicon oxynitride.

The encapsulation inorganic layer ENL-G and the first encapsulation layer ENL1 may encapsulate the color control layer CCF-G. The encapsulation inorganic layer ENL-G may be in contact with the first encapsulation layer ENL1. The encapsulation inorganic layer ENL-G may encapsulate a specific color control layer CCF-G, and may be in contact with side surfaces of adjacent color control layers CCF-R and CCF-B.

A second encapsulation layer ENL2 may be disposed under the color control layers CCF-R, CCF-G, and CCF-B. The second encapsulation layer ENL2 may encapsulate the color control layers CCF-R, CCF-G, and CCF-B. The second encapsulation layer ENL2 may be disposed in common in the first to third pixel areas PXA-R, PXA-G, and PXA-B.

The second encapsulation layer ENL2 may include an inorganic layer which is in contact with the encapsulation inorganic layer ENL-G. The inorganic layer may include silicon oxide, silicon nitride, or silicon oxynitride. The second encapsulation layer ENL2 may further include an organic layer disposed on the inorganic layer (hereinafter, may also be referred to as a second inorganic layer). The organic layer may provide a flat bottom surface. In an exemplary embodiment, the first encapsulation layer ENL1 may include silicon oxide, and the second encapsulation layer ENL2 may include silicon nitride.

Figure 4:
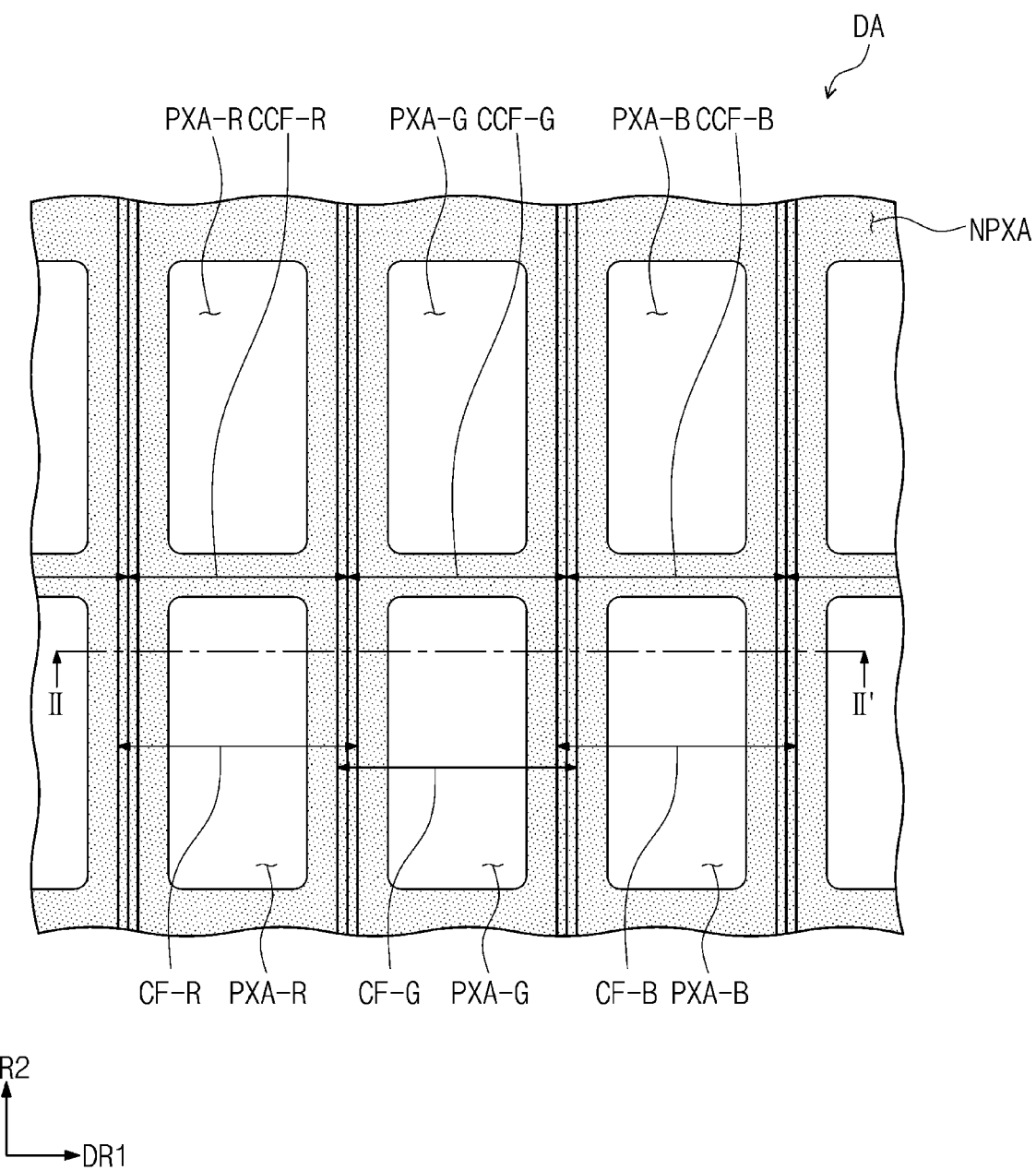
FIG. 4 is a plan view illustrating an upper display substrate corresponding to a display area according to an exemplary embodiment.
Figure 5:
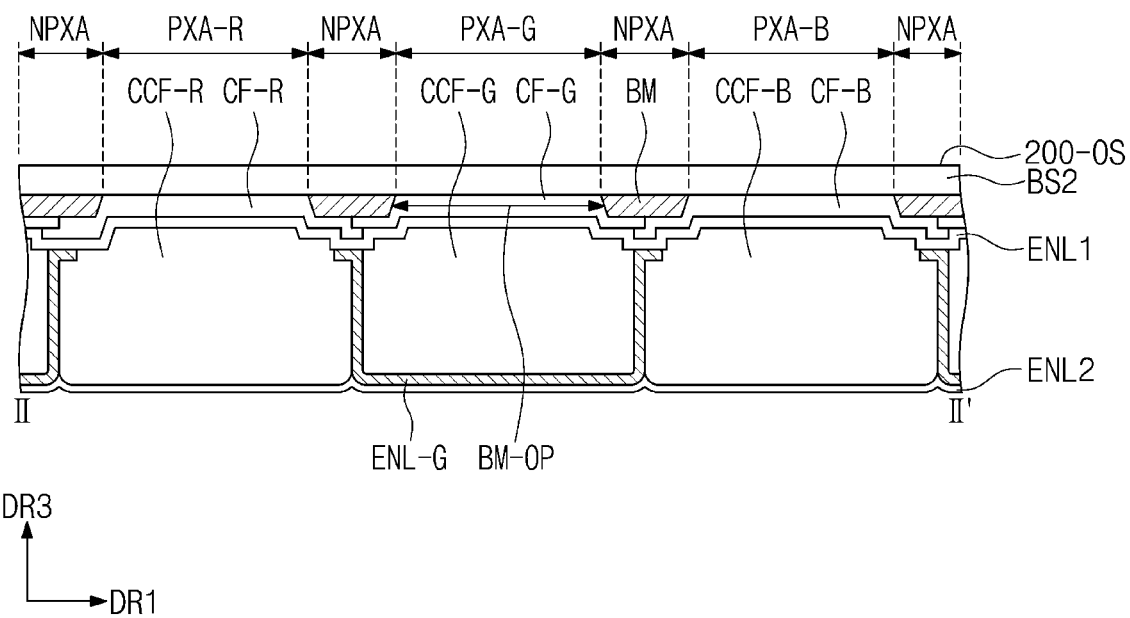
FIGS. 5, 6, and 7 are cross-sectional views illustrating upper display substrates corresponding to a display area according to exemplary embodiments.
Figure 6:
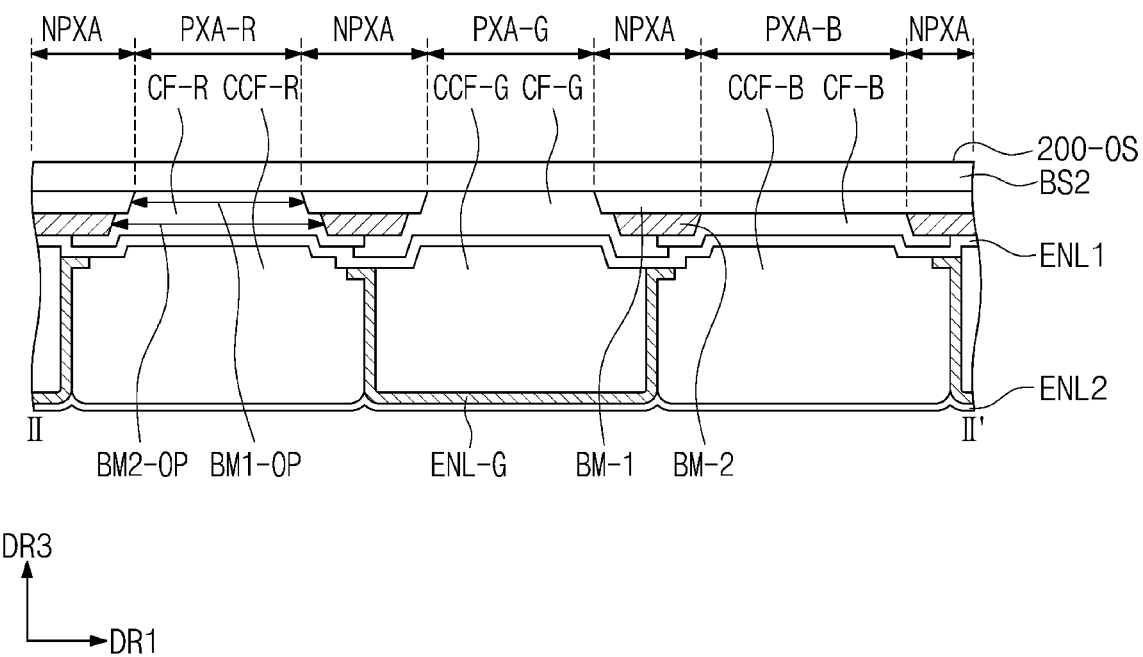
Figure 7:
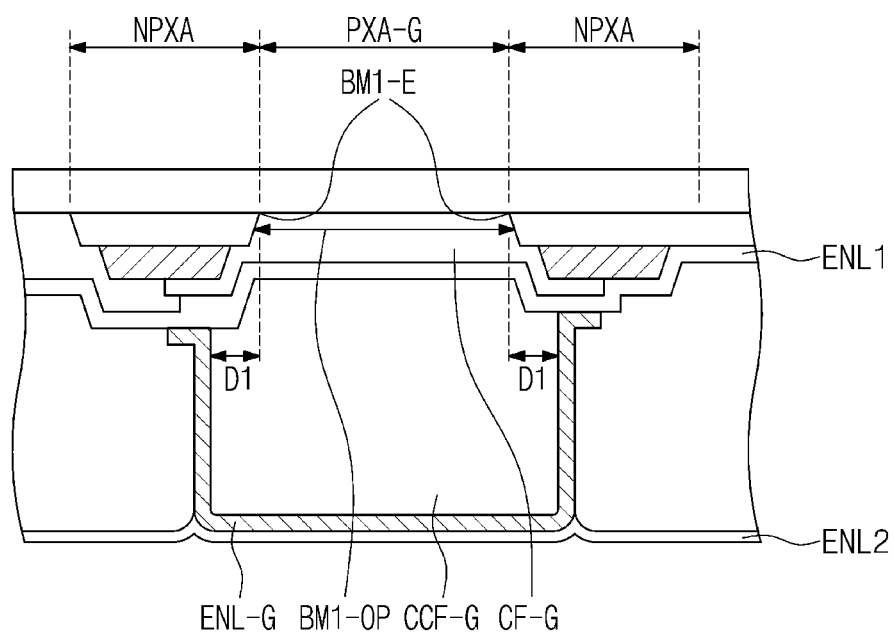

FIG. 4 is a plan view illustrating an upper display substrate 200 corresponding to the display area DA according to an exemplary embodiment. FIGS. 5 to 7 are cross-sectional views illustrating upper display substrates 200 corresponding to the display area DA according to exemplary embodiments. In FIG. 4, edges of first to third color filters CF-R, CF-G, and CF-B, and edges of first to third color control layers CCF-R, CCF-G, and CCF-B are illustrated to correspond to the first to third pixel areas PXA-R, PXA-G, and PXA-B.

As illustrated in FIGS. 4 and 5, the first to third color filters CF-R, CF-G, and CF-B may be disposed to correspond to the first to third pixel areas PXA-R, PXA-G, and PXA-B, respectively. The first to third color filters CF-R, CF-G, and CF-B may include pigments and/or dyes, which absorb light having different wavelength bands. The first color filter CF-R may be a red color filter, the second color filter CF-G may be a green color filter, and the third color filter CF-B may be a blue color filter.

The first to third color filters CF-R, CF-G, and CF-B may reduce a reflectance of external light. Each of the first to third color filters CF-R, CF-G, and CF-B may transmit light of a specific wavelength band, and may block light outside the corresponding wavelength band. Each of the first to third color filters CF-R, CF-G, and CF-B may absorb light outside the corresponding wavelength band.

Referring to FIGS. 4 and 5, the first to third color control layers CCF-R, CCF-G, and CCF-B may be disposed to correspond to the first to third pixel areas PXA-R, PXA-G, and PXA-B, respectively. The first color control layer CCF-R may absorb the blue light to generate the red light, and the second color control layer CCF-G may absorb the blue light to generate the green light. In particular, the first color control layer CCF-R and the second color control layer CCF-G may include different quantum dots from each other. The third color control layer CCF-B may transmit the blue light. The first to third color control layers CCF-R, CCF-G, and CCF-B may further include scattering particles. The scattering particles may be titanium oxide (TiO$_2$) or silica-based nanoparticles.

Referring to FIGS. 4 and 5, the encapsulation inorganic layer ENL-G may be disposed to correspond to a portion of the first to third color control layers CCF-R, CCF-G, and CCF-B. The encapsulation inorganic layer ENL-G may be disposed to selectively encapsulate a color control layer that has a great change over time among the first to third color control layers CCF-R, CCF-G, and CCF-B.

The first to third color control layers CCF-R, CCF-G, and CCF-B may have different compositions, and thus, may show different changes over time. Since the encapsulation inorganic layer ENL-G covers a specific color control layer having a relatively great change over time, the change in the specific color control layer over time may be reduced. In this manner, a deviation of the changes of primary colors over time may be minimized and improve display quality.

The color control layer having the relatively great change over time may be determined by physical properties of the quantum dots. The color control layer having quantum dots vulnerable to moisture may show a rapid change over time. This may cause reduction of brightness of specific color light.

The following table 1 shows measured results of changes over time of red, green, and blue color control layers CCF-R, CCF-G and CCF-B. The change over time was obtained by measuring a color change of reflected light by a specular component excluded (SCE) method.

TABLE 1

|  | Red color control layer | Green color control layer | Blue color control layer |
| --- | --- | --- | --- |
| 88 hours | 101% | 101% | 100% |
| 248 hours | 101% | 99% | 96% |
| 600 hours | 103% | 91% | 101% |
| 768 hours | 106% | 93% | 100% |

A great deviation in diffused of reflected light may indicate a great change over time. According to the table 1, the change over time of the green color control layer is the greatest.

In addition, the color control layer having the relatively great change over time may be determined by a weight ratio of the quantum dots. The color control layer CCF-R, CCF-G, or CCF-B may include the base resin and the quantum dots, and weight ratios (wt %) of the quantum dots in the color control layers CCF-R, CCF-G, and CCF-B may be different from each other.

In the illustrated exemplary embodiment, a weight % of second quantum dots in the second color control layer CCF-G may be greater than a weight % of first quantum dots in the first color control layer CCF-R. The third color control layer CCF-B may include the lowest weight % of quantum dots or may not include a quantum dot.

In an exemplary embodiment, the number of the quantum dots per volume in the color control layer CCF-G encapsulated by the encapsulation inorganic layer ENL-G may be more than the numbers of the quantum dots per volume in other color control layers CCF-R and CCF-B.

Referring to FIG. 6, a display panel DP may include a first partition pattern BM-1 and a second partition pattern BM-2. The first partition pattern BM-1 may include substantially the same material as the third color filter CF-B of FIG. 5. Thus, the first partition pattern BM-1 may also be defined as a color pattern. The second partition pattern BM-2 may include substantially the same material as the partition pattern BM of FIG. 5.

The first partition pattern BM-1 may be formed directly on the bottom surface of the second base substrate BS2. An opening BM1-OP corresponding to each of the first and second pixel areas PXA-R and PXA-G may be defined in the first partition pattern BM-1. The first partition pattern BM-1 and the third color filter CF-B may form a single body shape. In some exemplary embodiments, a stacking order of the first partition pattern BM-1 and the second partition pattern BM-2 may be changed.

The second partition pattern BM-2 may be disposed on a bottom surface of the first partition pattern BM-1. An opening BM2-OP corresponding to each of the first to third pixel areas PXA-R, PXA-G, and PXA-B may be defined in the second partition pattern BM-2. The openings BM2-OP of the second partition pattern BM-2, which correspond to the first and second pixel areas PXA-R and PXA-G, may have areas (or sizes) greater than those of the openings BM1-OP of the first partition pattern BM-1, which correspond to the first and second pixel areas PXA-R and PXA-G. One of the openings BM2-OP of the second partition pattern BM-2 may define the third pixel area PXA-B.

Referring to FIG. 7, the encapsulation inorganic layer ENL-G may increase efficiency of light outputted from the second pixel area PXA-G. The second color light converted by the quantum dot of the second color control layer CCF-G may be radiated from the quantum dot. The radiated light may be totally reflected by the encapsulation inorganic layer ENL-G. The light radiated from the quantum dot may be reflected by the encapsulation inorganic layer ENL-G, and then may be outputted to the outside through the opening BM1-OP. The encapsulation inorganic layer ENL-G may prevent light radiated from the second color control layer CCF-G from leaking into other color control layers CCF-R and CCF-B.

The opening BM1-OP corresponding to the second pixel area PXA-G may be defined by an inner edge BM1-E of the first partition pattern BM-1. A distance D1 between the inner edge BM1-E and the encapsulation inorganic layer ENL-G on a reference line parallel to the bottom surface of the second base substrate BS2 (e.g., on the first directional axis DR1 of FIG. 7) may be about 12 micrometers or less. In the exemplary embodiment of FIG. 5, the distance D1 may be measured based on an inner edge of the partition pattern BM. The light reflected from the encapsulation inorganic layer ENL-G may improve light output efficiency, and thus, reduction of brightness by the change over time may be compensated.

Figure 8:
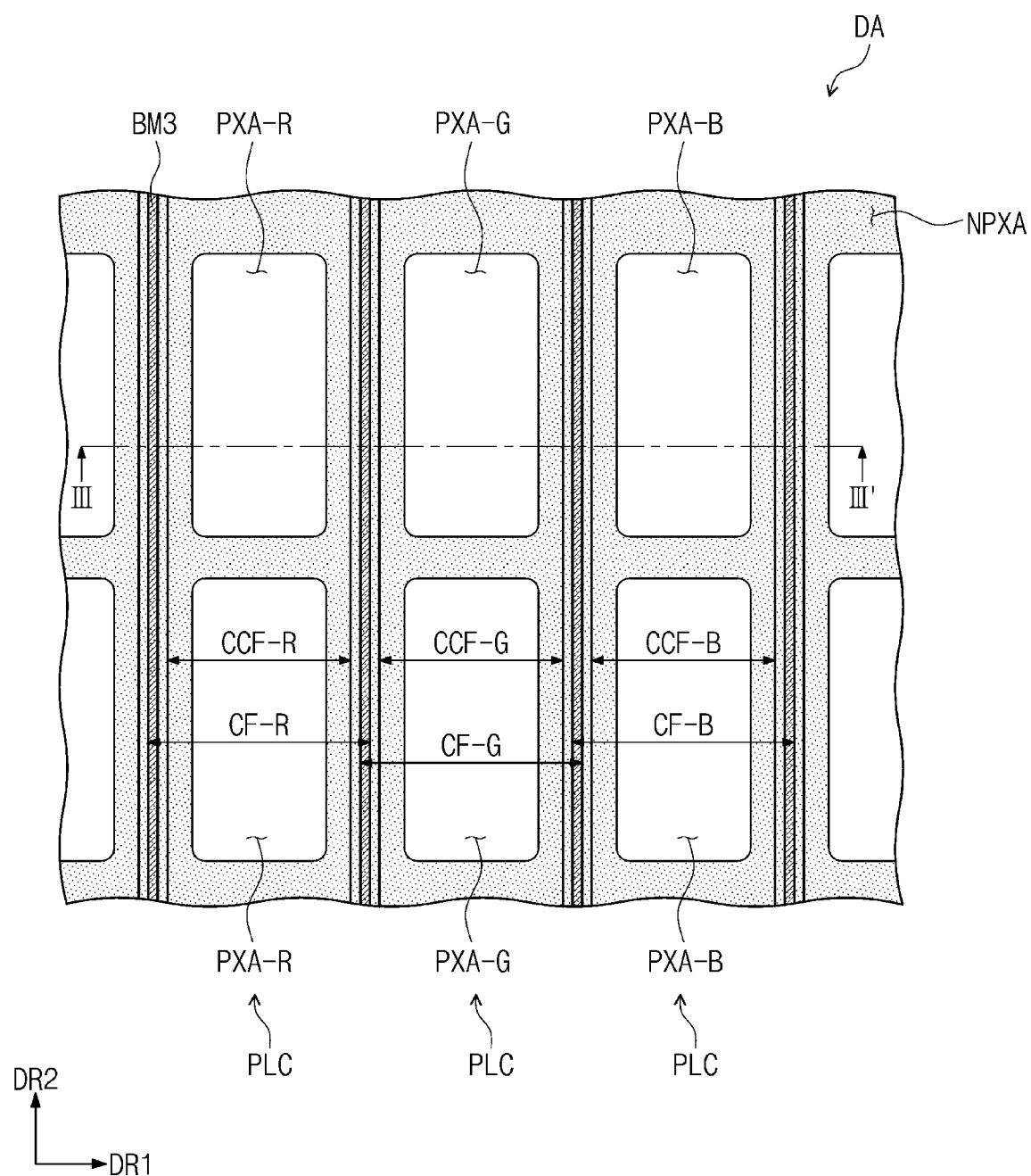
FIG. 8 is a plan view illustrating an upper display substrate corresponding to a display area according to an exemplary embodiment.

FIG. 8 is a plan view illustrating an upper display substrate 200 corresponding to the display area DA according to an exemplary embodiment. FIG. 9 is a cross-sectional view illustrating the upper display substrate 200 corresponding to the display area DA according to an exemplary embodiment.

FIGS. 8 and 9 illustrate the upper display substrate 200 including the partition pattern BM, and the upper display substrate 200 may further include a column partition pattern (or a third partition pattern) BM3. The column partition pattern BM3 may divide pixel columns PLC.

According to the illustrated exemplary embodiment, the first to third color control layers CCF-R, CCF-G, and CCF-B may be spaced apart from each other in the first direction DR1. The second encapsulation layer ENL2 may be in contact with the first encapsulation layer ENL1. The first and third color control layers CCF-R and CCF-B may be encapsulated by the second encapsulation layer ENL2, and the second color control layer CCF-G may be doubly encapsulated by the encapsulation inorganic layer ENL-G and the second encapsulation layer ENL2.

Slits SLT may be defined between the first to third color control layers CCF-R, CCF-G, and CCF-B. A portion of the second encapsulation layer ENL2 may be disposed in the slit SLT. The column partition pattern BM3 may be disposed on the portion of the second encapsulation layer ENL2, which corresponds to the slit SLT. The column partition pattern BM3 may include a black coloring agent. In some exemplary embodiments, the column partition pattern BM3 may be omitted.

According to the exemplary embodiments, the encapsulation inorganic layer may cover a specific color control layer having a relatively great change over time. As such, the change over time of the specific color control layer may be reduced. In this manner, the deviation of the changes over time of primary colors may be minimized to improve display quality.

The encapsulation inorganic layer may totally reflect light generated from the color control layer, and thus, the light output efficiency of specific color light may be improved. As such, a brightness difference between the primary colors may be minimized.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display panel comprising:
   a lower display substrate comprising a light emitting element configured to generate source light; and
   an upper display substrate including first, second, and third pixel areas and a peripheral area adjacent to the first, second, and third pixel areas,
   wherein the upper display substrate comprises:
   a base substrate;
   a first partition pattern disposed on a bottom surface of the base substrate, overlaps with the peripheral area, and has first, second, and third openings corresponding to the first, second, and third pixel areas, respectively;
   first, second, and third color filters disposed on the bottom surface of the base substrate and overlapping with the first, second, and third pixel areas, respectively;
   first, second, and third color control layers disposed on the first, second, and third color filters, respectively; and
   an encapsulation inorganic layer covering the second color control layer and exposing at least one of the first and third color control layers.

2. The display panel of claim 1, further comprising a first inorganic layer disposed on the bottom surface of the base substrate, on the first partition pattern, and on the first, second, and third color filters.

3. The display panel of claim 2, wherein the encapsulation inorganic layer is in contact with the first inorganic layer, and the second color control layer is encapsulated by the first inorganic layer and the encapsulation inorganic layer.

4. The display panel of claim 2, wherein the first color control layer and the third color control layer are in contact with the encapsulation inorganic layer.

5. The display panel of claim 2, further comprising a second inorganic layer disposed on the first color control layer, the third color control layer, and the encapsulation inorganic layer,
   wherein the second inorganic layer is in contact with the encapsulation inorganic layer.

6. The display panel of claim 1, wherein:
   the source light is third color light;
   the first color control layer is configured to convert the third color light into first color light, the second color control layer is configured to convert the third color light into second color light, and the third color control layer is configured to transmit the third color light; and
   the first color filter is configured to transmit the first color light, the second color filter is configured to transmit the second color light, and the third color filter is configured to transmit the third color light.

7. The display panel of claim 6, wherein:
   the first color control layer includes a base resin and first quantum dots mixed with the base resin, and the second color control layer includes a base resin and second quantum dots mixed with the base resin; and
   a weight % of the second quantum dots in the second color control layer is greater than a weight % of the first quantum dots in the first color control layer.

8. The display panel of claim 6, wherein:
   the first color control layer includes a base resin and first quantum dots mixed with the base resin, and the second color control layer includes a base resin and second quantum dots mixed with the base resin; and
   the number of the second quantum dots per volume in the second color control layer is greater than the number of the first quantum dots per volume in the first color control layer.

9. The display panel of claim 6, wherein the first partition pattern includes a black coloring agent.

10. The display panel of claim 6, further comprising a second partition pattern disposed on the bottom surface of the base substrate, overlaps with the first partition pattern, and has first and second openings corresponding to at least the first and second pixel areas, respectively.

11. The display panel of claim 10, wherein the second partition pattern is configured to transmit the third color light, and the second partition pattern and the third color filter form a single body shape.

12. The display panel of claim 11, wherein the second partition pattern is closer to the base substrate than the first partition pattern.

13. The display panel of claim 1, wherein the first, second, and third color control layers are spaced apart from each other in the peripheral area.

14. The display panel of claim 13, further comprising a third partition pattern disposed between the first, second, and third color control layers in the peripheral area.

15. The display panel of claim 1, wherein:
   the light emitting element includes first, second, and third light emitting elements disposed to correspond to the first, second, and third pixel areas, respectively; and
   emission layers of the first, second, and third light emitting elements form a single body shape.

16. A display panel comprising:
   a lower display substrate configured to generate source light; and
   an upper display substrate including first, second, and third pixel areas and a peripheral area adjacent to the first, second, and third pixel areas, wherein the upper display substrate comprises:
- a base substrate;
- a color pattern disposed on a bottom surface of the base substrate, overlaps with the peripheral area and the third pixel area, and has first and second openings corresponding to the first and second pixel areas, respectively;
- first and second color filters disposed on the bottom surface of the base substrate and overlapping with the first and second pixel areas, respectively;
- first, second, and third color control layers disposed on the first and second color filters and the color pattern, respectively; and
- an encapsulation inorganic layer covering the second color control layer.

17. The display panel of claim 16, further comprising a partition pattern disposed on the bottom surface of the base substrate and has first, second, and third openings corresponding to the first, second, and third pixel areas, respectively.

18. The display panel of claim 17, wherein the color pattern has substantially the same color as the source light, and the partition pattern has a black color.

19. The display panel of claim 16, wherein:

the color pattern includes an inner edge defining the second opening; and a distance between the inner edge and the encapsulation inorganic layer on a reference line parallel to the bottom surface of the base substrate is about 12 micrometers or less.

20. The display panel of claim 16, further comprising an inorganic layer covering the first color control layer, the third color control layer, and the encapsulation inorganic layer, wherein the encapsulation inorganic layer is in contact with the inorganic layer.

* * * * *